(12) United States Patent
Lesea et al.

(10) Patent No.: US 6,353,341 B1
(45) Date of Patent: Mar. 5, 2002

(54) METHOD AND APPARATUS FOR DISCRIMINATING AGAINST SIGNAL INTERFERENCE

(75) Inventors: Austin H. Lesea, Los Gatos; Peter H. Alfke, Los Altos Hills; Jennifer Wong, Fremont; Steven P. Young, San Jose, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/439,844

(22) Filed: Nov. 12, 1999

(51) Int. Cl.$^7$ ............................................. G01R 29/02
(52) U.S. Cl. .......................................... 327/34; 327/205
(58) Field of Search ........................... 327/34, 205, 310, 327/311, 317, 551

(56) References Cited

U.S. PATENT DOCUMENTS

| | | | | |
|---|---|---|---|---|
| 3,970,944 A | * | 7/1976 | Heullwegen | 327/34 |
| 4,431,930 A | * | 2/1984 | Monticelli | 327/34 |
| 4,525,635 A | * | 6/1985 | Gillberg | 327/34 |
| 4,596,939 A | * | 6/1986 | Yamada | 327/205 |
| 4,760,279 A | * | 7/1988 | Saito et al. | 327/34 |
| 4,775,840 A | * | 10/1988 | Ohmori et al. | 327/34 |
| 4,795,915 A | * | 1/1989 | Sun et al. | 327/34 |
| 5,467,053 A | * | 11/1995 | Wuidart et al. | 327/551 |
| 5,699,009 A | * | 12/1997 | Ramseyer et al. | 327/34 |
| 5,723,993 A | * | 3/1998 | Cha | 327/172 |
| 5,748,034 A | * | 5/1998 | Ketineni et al. | 327/34 |
| 5,808,486 A | * | 9/1998 | Smiley | 327/34 |

FOREIGN PATENT DOCUMENTS

| | | | | |
|---|---|---|---|---|
| JP | 358059622 | * | 4/1983 | 327/34 |
| JP | 401047120 | * | 2/1989 | 327/34 |

\* cited by examiner

*Primary Examiner*—Tuan T. Lam
(74) *Attorney, Agent, or Firm*—William L. Paradice

(57) ABSTRACT

A clock signal is monitored to detect a transition from a first logic state to a second logic state. Once this transition is detected, subsequent transitions of the clock signal are ignored for a predetermined time period during which signal interference is most significant. After lapse of the predetermined time period, the clock signal is again monitored to detect subsequent state transitions. In some embodiments, the clock signal is delayed using a delay circuit to produce a delayed clock signal which is used to force the clock signal to the second logic state for a predetermined time period. In one embodiment, the predetermined time period is user-selectable via one or more selectable taps on the delay circuit.

4 Claims, 3 Drawing Sheets

METHOD AND APPARATUS FOR DISCRIMINATING AGAINST SIGNAL INTERFERENCE

FIELD OF THE INVENTION

This invention relates generally to digital systems and specifically to signal interference in digital systems.

BACKGROUND OF THE INVENTION

In digital systems, data is typically sampled on the rising edge of a system clock, although in some systems data may be sampled on the falling edge of the clock (or even on both clock edges). FIG. 1 shows an ideal clock signal CLK_ideal having a period T. Associated data is sampled on each rising edge of CLK_ideal. As shown in FIG. 1, CLK_ideal is a clean signal having smooth transitions between logic low and high states, and thus data is sampled once per clock cycle.

In actual applications, however, signal interference (e.g., cross-talk, noise, ground bounce) may cause one or more undesirable glitches in the clock signal which may be erroneously detected as additional clock edges. These unintended clock edges cause inadvertent sampling of the data which, in turn, may lead to data errors.

For example, FIG. 2 shows a clock signal CLK_actual having associated signal interference that produces an unintended state transition within each rising edge. That is, rather than having a smooth rising edge from logic low to logic high, CLK_actual rises to a first level A, falls slightly to a second level B, and then rises again to a maximum level. Here, both the initial transition to level A and the subsequent transition to the maximum level may be interpreted as rising clock edges. The inadvertent state transition occurring after the rising edge of CLK_actual causes data to be sampled more than once per clock cycle, and thereby may result in data errors.

Unintended state transitions in the clock signal are typically filtered by using voltage hysteresis to detect logic state transitions. Voltage hysteresis filters unwanted voltage transitions by using different thresholds for detecting rising and falling edges. For example, as shown in FIG. 2, a rising clock edge is detected when CLK_actual exceeds an upper threshold X, and a falling edge is detected when CLK_actual falls below a lower threshold Y. Thus, setting the hysteresis levels at X and Y filters undesirable voltage transitions in CLK_actual between levels X and Y.

Although hysteresis is effective in discriminating against unintended state transitions, controlling the upper and lower hysteresis levels over temperature and process variations is difficult, and typically requires complex circuitry such as, for instance, band-gap reference circuits and high-speed comparators. Further, the upper and lower hysteresis levels are usually set during circuit fabrication and, therefore, cannot later be changed to compensate for actual circuit performance and/or interference characteristics. In addition, although possible to implement a dynamic hysteresis that tracks circuit and signal interference characteristics, the feedback circuitry required to implement dynamic hysteresis is of a size and complexity which renders it impractical to independently implement for a large number of input/output (I/O) pins.

SUMMARY OF THE INVENTION

An apparatus and method are disclosed that discriminate against signal interference over temperature and process variations without consuming significant silicon area. In accordance with one embodiment of the present invention, a clock signal is monitored to detect a transition from a first logic state to a second logic state. Once this transition is detected, subsequent transitions of the clock signal are ignored for a predetermined time period during which signal interference may be most significant. After lapse of the predetermined time period, the clock signal is again monitored to detect subsequent state transitions. In some embodiments, the clock signal is delayed using a delay circuit to produce a delayed clock signal, and the clock signal and the delayed clock signal are logically combined to determine the predetermined time period. In one embodiment, the predetermined time period is user-selectable via one or more taps on the delay circuit.

Like components in the Figures are similarly labeled.

DETAILED DESCRIPTION OF THE INVENTION

Embodiments of the present invention are discussed below in the context of a rising clock edge for simplicity only. It is to be understood that embodiments of the present invention are equally applicable for discriminating against noise in any edge-triggered clock signal. Further, although especially useful in programmable logic devices (PLDs), present embodiments are advantageous in any circuit that utilizes a clock signal. Accordingly, the present invention is not to be construed as limited to specific examples described herein but rather includes within its scope all embodiments defined by the appended claims.

Figure 1:
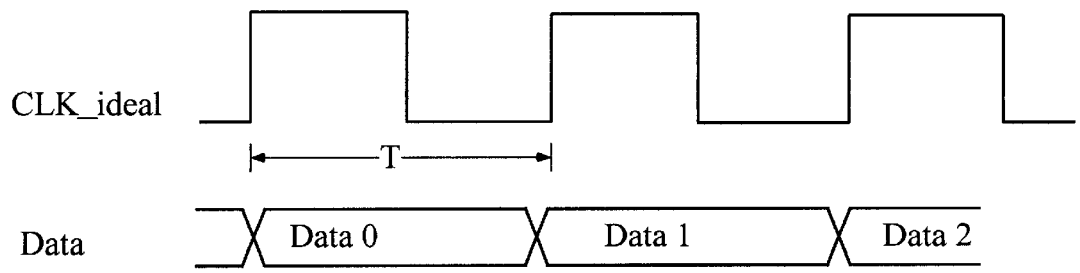
FIG. 1 illustrates an ideal clock signal and associated data.
Figure 2:
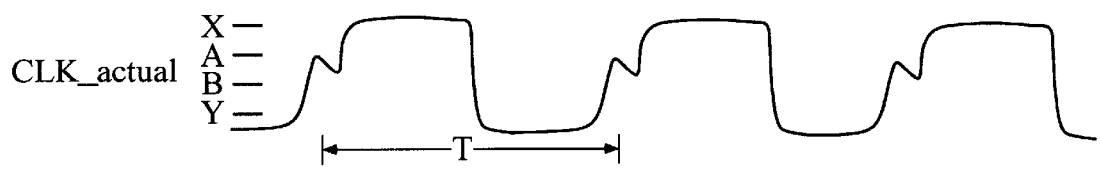
FIG. 2 illustrates an actual clock signal affected by interference.
Figure 3:
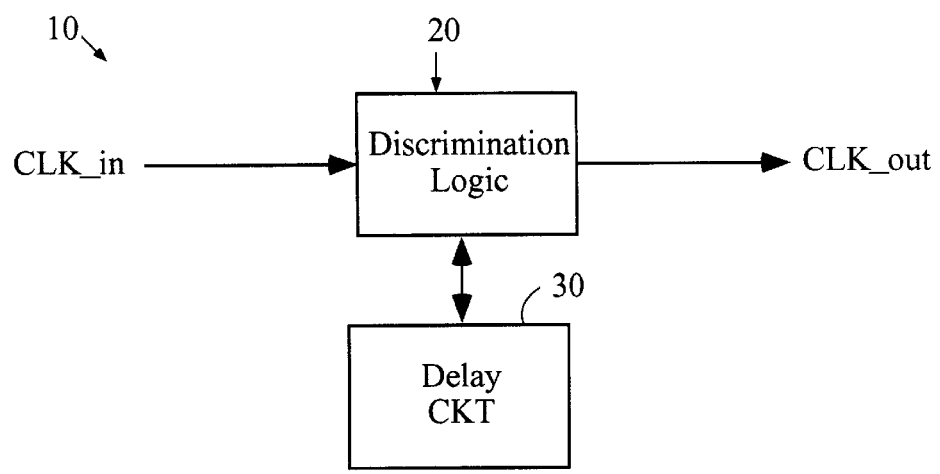
FIG. 3 is a block diagram illustrating a noise discrimination circuit in accordance with the present invention.

FIG. 3 shows a noise discrimination circuit 10 in accordance with the present invention. An input clock signal CLK_in is provided to an input terminal of discrimination logic 20, which in turn has an output terminal to provide a noise discriminated clock signal CLK_out. A delay circuit 30 generates a delay of a predetermined time period, and is connected to discrimination logic 20. After a rising clock edge is detected, discrimination logic 20 ignores subsequent transitions of CLK_in during the delay period provided by delay circuit 30. After the delay, i.e., after lapse of the predetermined time period, subsequent transitions of CLK_in are detected, and may thereafter cause the associated data to be sampled. Since signal interference is typically the strongest and occurs most frequently near the rising clock edge, detecting the first state transition (e.g., rising edge) and then ignoring subsequent state transitions for a predetermined time period is highly effective in discriminating against clock noise.

Figure 4:
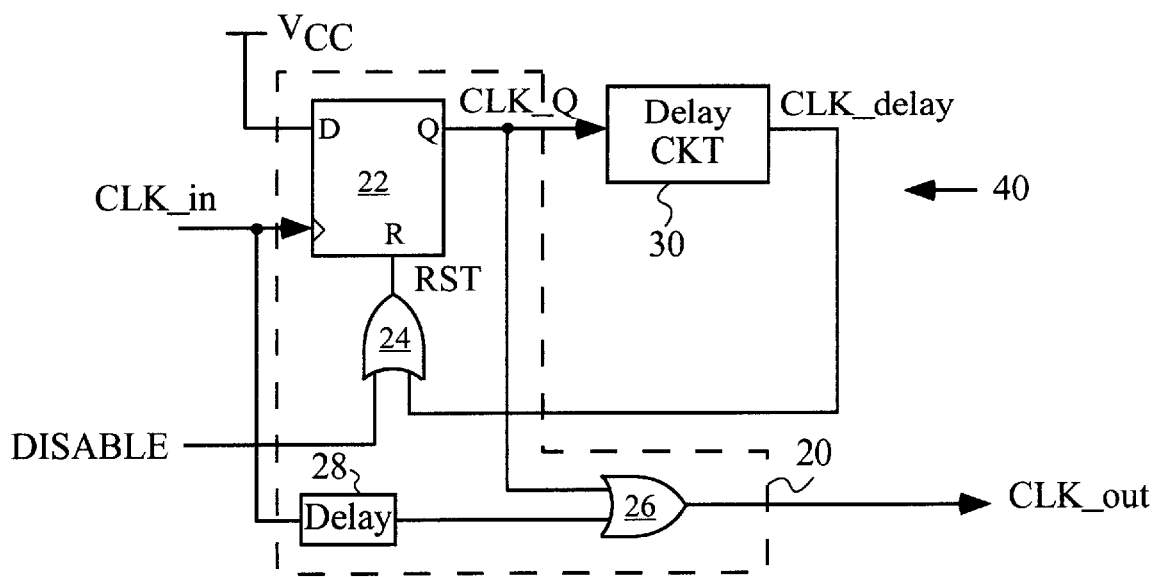
FIG. 4 is a circuit diagram of logic employed according to one embodiment of the noise discrimination circuit of FIG. 3.

FIG. 4 shows a noise discrimination circuit 40 that is one embodiment of the circuit 10 of FIG. 3. In the embodiment of FIG. 4, discrimination logic 20 includes a flip-flop 22, two logic OR gates 24 and 26, and a delay circuit 28. The data input D of flip-flop 22 is connected to a supply voltage $V_{cc}$ and therefore remains in a logic high state. Input clock signal CLK_in is provided to the clock input terminal of flip-flop 22. Delay circuit 30 has an input terminal connected to the output terminal Q of flip-flop 22 and has an output terminal connected to an input terminal of OR-gate 24, which has another input terminal coupled to receive a disable signal DISABLE. OR-gate 24 has an output terminal connected to the reset terminal of flip-flop 22. OR-gate 26 has a first input terminal coupled to the clock input terminal via delay circuit 28, and has a second input terminal coupled to the output terminal Q of flip-flop 22. Delay circuit 28, which may be any well-known delay element, provides a gate delay equal to that of flip-flop 22 such that signals CLK_in and CLK_Q arrive at respective input terminals of OR-gate 26 at the same time to generate CLK_out. Delay circuit 28 prevents a fast glitch on the rising edge of CLK_in from passing through to CLK_out. Designing the delays of flip-flop 22 and OR-gate 26 can be optimized to minimize the need for delay circuit 28 altogether.

Figure 5:
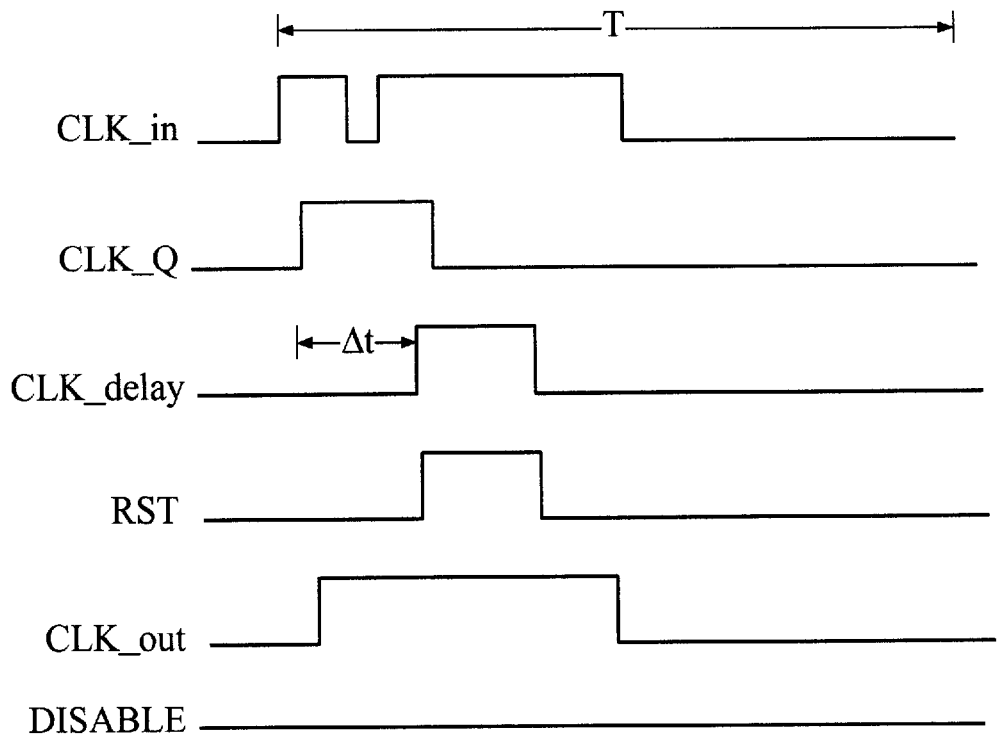
FIG. 5 is a timing diagram illustrating operation of the noise discrimination circuit of FIG. 4.

FIG. 5 shows the logic states of the various signals of the circuit 40. Input clock signal CLK_in has a period of T and includes signal interference (e.g., crosstalk, ground bounce, noise) that causes a glitch, or unintended state transition, just after the rising clock edge, as shown in FIG. 5.

The transition of CLK_in to logic high latches the logic high $V_{cc}$ into flip-flop 22, which in turn drives its output signal CLK_Q to logic high. The logic high CLK_Q drives output clock signal CLK_out to logic high via OR-gate 26. CLK_out is maintained in a logic high state via OR-gate 26 until CLK_Q is reset to logic low via a signal CLK_delay provided by delay circuit 30. In this manner, signal interference is filtered from the clock signal CLK_in while CLK_Q remains in a logic high state. The transition of CLK_OUT to logic high may be used to sample data into an associated circuit such as, for instance, a PLD (not shown for simplicity).

Delay circuit 30 delays signal CLK_Q by a predetermined delay $\Delta t$ to generate delayed signal CLK_delay, as shown in FIG. 5. CLK_delay is provided to the reset terminal RST of flip-flop 22 via OR-gate 24. Thus, CLK_delay transitions to logic high and resets flip-flop 22 via OR gate 24 $\Delta t$ after CLK_Q transitions to logic high. Accordingly, CLK_Q remains logic high to maintain output clock signal CLK_out logic high for approximately $\Delta t$ after the rising edge of CLK_in. When reset, flip-flop 22 drives its output signal CLK_Q to logic low, which in turn allows CLK_in to propagate through OR-gate 26 as CLK_out. Flip-flop 22 is ready to detect a subsequent rising edge of CLK_in.

The logic high CLK_in is provided to the other input terminal of OR-gate 26 via delay circuit 28. Thus, after CLK_Q has been reset to logic low by CLK_delay, the subsequent state change of CLK_in to logic low drives CLK_out to logic low via OR-gate 26. As mentioned above, delay circuit 28 provides a gate delay equal to that of flip-flop 22 to ensure that CLK_in and CLK_Q arrive at respective input terminals of OR-gate 26 at the same time. In this manner, glitches in CLK_in that occur before CLK_in's transition to logic high is correctly latched in flip-flop 22 (and thereafter used to maintain CLK_out in a logic high state for the delay period $\Delta t$) do not prematurely drive CLK_out to logic low.

In the embodiment of FIG. 4, flip-flop 22 may be reset via OR-gate 24 by driving signal DISABLE to logic high, thereby disabling circuit 40. In one embodiment, OR-gate 24 may be eliminated and delayed signal CLK_delay is provided directly to the reset terminal RST of flip-flop 22.

Delay circuit 30 may be any well-known circuit which produces a predetermined gate delay. In some embodiments, delay circuit 30 has a plurality of user-selectable taps that allow for selection from a plurality of predetermined time delays when generating the delayed signal CLK_delay. This allows users to control the time period $\Delta t$ during which the signal CLK_out is forced to logic high. In one embodiment, delay circuit 30 has 3 selectable taps which provide a minimal delay of approximately 2 ns, a mid-range delay of approximately 5 ns, and a maximum delay of approximately 10 ns.

Figure 6:
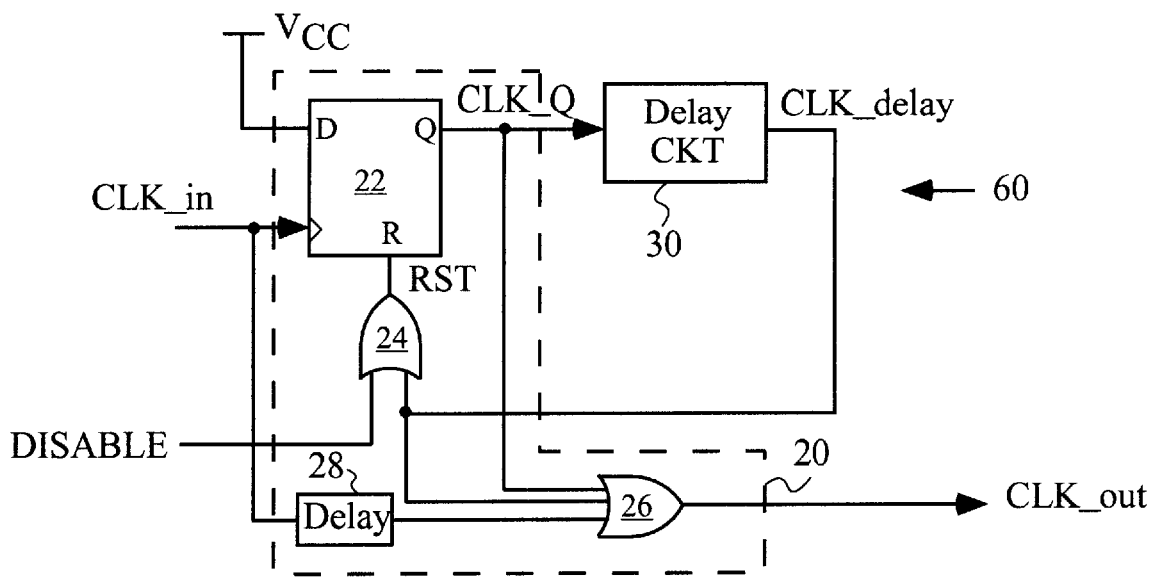
FIG. 6 is a circuit diagram of logic employed according to another embodiment of the noise discrimination circuit of FIG. 3.
Figure 7:
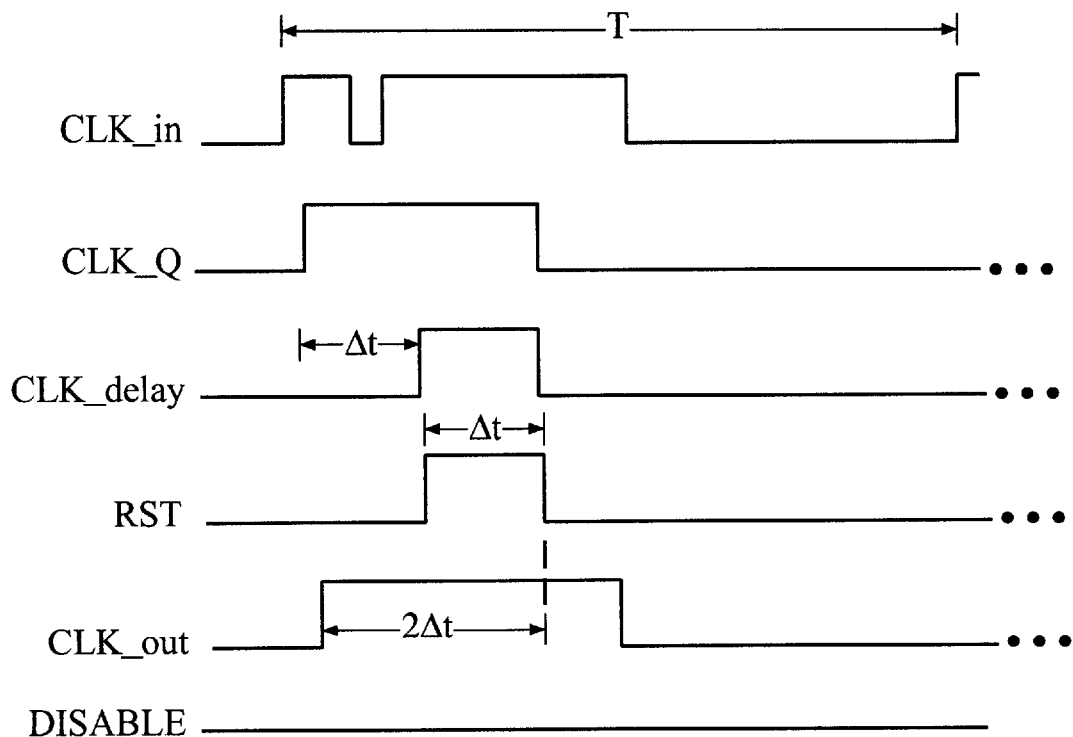
FIG. 7 is a timing diagram illustrating operation of the noise discrimination circuit of FIG. 6.

In some embodiments, the delayed signal CLK_delay is provided to a third input terminal of OR-gate 26 so as to force output clock signal CLK_out high while CLK_delay is high, as shown in FIG. 6, and thereby doubling the time period during which CLK_out is forced high. Accordingly, in these embodiments, discrimination circuit 60 forces CLK_out high for approximately $2\Delta t$, irrespective of CLK_in, as shown in FIG. 7.

As described above, the present invention uses time discrimination to ignore unintended clock transitions caused by signal interference. Thus, unlike prior art techniques that use voltage discrimination to ignore unintended clock transitions, the present invention does not need complex circuitry (e.g., band-gap reference circuits and comparators) to implement hysteresis on sampled clock edges. Rather, the present invention may filter clock signal interference for associated host circuits such as PLDs with a minimal use of silicon area.

The present invention is especially well-suited for use with PLDs that include one or more delay lines at each input/output (I/O) pin. For example, PLDs such as the Virtex™ series field programmable gate array (FPGA) available from Xilinx, Inc., of San Jose, Calif. may include 500 or 1000 I/O pins each having its own delay line having one or more taps. These delay lines, typically provided to provide suitable set-up and hold times for associated I/O pins, are easily adapted in accordance with the present invention to provide the time-based signal interference discrimination described herein.

Further, since changes in circuit speed resulting from temperature and process variations for the host circuit are similar to those for delay lines, the present invention provides an automatic tracking feature without feedback. Thus, for instance, although clock speeds increase as the temperature is lowered, the speed of delay circuit 30 increases in an approximately proportional manner. The increased speed in the delay circuit 30 reduces the predetermined delay $\Delta t$, thereby tracking faster clock speeds.

While particular embodiments of the present invention have been shown and described, it will be obvious to those skilled in the art that changes and modifications may be made without departing from this invention in its broader aspects and, therefore, the appended claims encompass within their scope all such changes and modifications as fall within the true spirit and scope of this invention.

What is claimed is:

1. A circuit for disncriminating between a clock signal and signal interference on the clock signal, comprising:

means for monitoring the clock signal to detect a transition from a first logic state to a second logic state; and means for ignoring subsequent transitions of the clock signal for a predetermined time period after detection of the first-mentioned transition, wherein the means for ignoring comprises a delay circuit and a logic circuit, the logic circuit comprising:
- a first logic gate having a first input terminal coupled to receive the clock signal, a second input terminal coupled to an output terminal of the delay circuit, and an output terminal coupled to provide an output clock signal; and
- a second logic gate having a first input terminal coupled to the output terminal of the delay circuit, a second input terminal coupled to receive an enable signal, and an output terminal coupled to a reset terminal of the means for monitoring.

2. A circuit for discriminating between a clock signal and signal interference on the clock signal, comprising:

means for monitoring the clock signal to detect a transition from a first logic state to a second logic state; and means for ignoring subsequent transitions of the clock signal for a predetermined time period after detection of the first-mentioned transition, wherein the means for ignoring comprises a delay circuit and a logic circuit, the logic circuit comprising an OR gate having a first input terminal coupled to receive the clock signal, a second input terminal coupled to an output terminal of the delay circuit, and an output terminal coupled to provide an output clock signal.

3. The circuit of claim 1, wherein the second logic gate comprises an OR gate.

4. The circuit of claim 1, wherein the first logic gate comprises an OR gate.

* * * * *